United States Patent
Joung et al.

(10) Patent No.: US 7,824,975 B2
(45) Date of Patent: Nov. 2, 2010

(54) METHOD OF FABRICATING SEMICONDUCTOR DEVICE HAVING GATE SPACER LAYER WITH UNIFORM THICKNESS

(75) Inventors: Yong Soo Joung, Seoul (KR); Kyoung Bong Rouh, Goyang-si (KR); Hye Jin Seo, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 162 days.

(21) Appl. No.: 12/164,677

(22) Filed: Jun. 30, 2008

(65) Prior Publication Data
US 2009/0170297 A1 Jul. 2, 2009

(30) Foreign Application Priority Data
Dec. 28, 2007 (KR) .................. 10-2007-0141036

(51) Int. Cl.
H01L 21/8238 (2006.01)
(52) U.S. Cl. .................. 438/199; 438/275; 438/279; 438/299; 257/E21.632
(58) Field of Classification Search .......... 438/299, 438/199, 200, 275, 279; 257/E21.632
See application file for complete search history.

(56) References Cited

U.S. PATENT DOCUMENTS

| 6,673,705 | B2 * | 1/2004 | Miyashita | 438/585 |
| 6,794,256 | B1 | 9/2004 | Fuselier et al. | 438/286 |
| 6,815,320 | B2 | 11/2004 | Kim et al. | |
| 7,064,071 | B2 | 6/2006 | Schwan | |
| 7,282,426 | B2 * | 10/2007 | Mathew et al. | 438/525 |
| 2003/0059983 | A1 * | 3/2003 | Ota et al. | 438/128 |
| 2006/0194381 | A1 | 8/2006 | Wei et al. | 438/197 |
| 2006/0281273 | A1 | 12/2006 | Watanabe et al. | |

\* cited by examiner

*Primary Examiner*—Michael Trinh
(74) *Attorney, Agent, or Firm*—Marshall, Gerstein & Borun LLP

(57) ABSTRACT

A method of fabricating a semiconductor device having a gate spacer layer with a uniform thickness wherein a gate electrode layer pattern is formed on a substrate and ion implantation processes of respectively different doses are formed on side walls of the gate electrode layer patterns in respective first and second regions of the substrate. A first gate spacer layer is formed on the gate electrode layer pattern where the ion implantation process is performed. A second gate spacer layer is formed on the first gate spacer layer.

3 Claims, 5 Drawing Sheets

METHOD OF FABRICATING SEMICONDUCTOR DEVICE HAVING GATE SPACER LAYER WITH UNIFORM THICKNESS

CROSS-REFERENCE TO RELATED APPLICATION

Priority to Korean patent application number 10-2007-0141036, filed on Dec. 28, 2007, the disclosure of which is incorporated by reference in its entirety, is claimed.

BACKGROUND OF THE INVENTION

The invention relates to a method of fabricating a semiconductor device and, more particularly, to a method of fabricating a semiconductor device having a gate spacer layer with a uniform thickness.

Generally, performance of an enormous number of processes is required to fabricate a semiconductor memory device such as a dynamic random access memory (DRAM). These processes include a stacking process, an etching process, and an ion implantation process, which are typically performed by a wafer unit. However, these wafer unit processes are not uniformly performed on a wafer, since there may be limitations such as equipment uniformity for processes or uniformity of process conditions. For example, a loading effect occurs during a process of fabricating a semiconductor, so that uniformity of the process can be adversely affected. The loading effect may be shown in various manufacturing processes. For example, while performing an etching process on the same wafer, an etching rate difference or a profile difference occurs due to the loading effect, which is caused depending on the size of a wafer exposed to plasma.

The uniformity of the process may cause many restrictions in device performance. For example, an insulating layer for a gate spacer, e.g., a nitride layer, is deposited and then a conventional anisotropic etching process is performed on the nitride layer to form a gate spacer layer on a sidewall of a gate. At this point, the loading effect may occur during the nitride layer deposition process or the etching process. Therefore, the gate spacer layer with a uniform thickness may not be formed on an entire surface of the wafer. For example, the center of the wafer has a relatively small thickness of the gate spacer layer and its edge has a relatively large thicknesses of the gate spacer layer.

If the thickness of the gate spacer layer is not uniform, a threshold voltage of a p-type metal oxide semiconductor (PMOS), especially in a peripheral circuit region, can be affected, so that a uniform threshold voltage may not be realized over the entire surface of a wafer. That is, due to the thickness difference between the center and the edge of the wafer, threshold voltage distribution of a PMOS in a peripheral circuit region may differ from that of the remainder of the circuit. Particularly, relatively high threshold voltage distribution may occur at the center of the wafer where the thickness of a gate spacer layer is relatively thin. Also, relatively low threshold voltage distribution may occur at the edge of the wafer where the thickness of a gate spacer layer is relatively thick.

SUMMARY OF THE INVENTION

Embodiments of the invention provide a method of fabricating a semiconductor device having a gate spacer layer with a uniform thickness In one embodiment, a method of fabricating a semiconductor device comprises: forming a gate electrode layer pattern on a substrate, the gate electrode pattern defining sides walls; performing ion implantation processes of respectively different doses of implanted ions on the gate electrode pattern side walls in respective first and second regions of the substrate; forming a first gate spacer layer on the gate electrode layer pattern where the ion implantation process is performed; and forming a second gate spacer layer on the first gate spacer layer.

In another embodiment, a method of fabricating a semiconductor device comprises: forming a gate electrode layer pattern on a substrate defining a plurality of regions, the gate electrode layer pattern defining side walls; performing ion implantation processes of respectively different doses of implanted ions on the side walls of the gate electrode layer patterns in the respective regions; forming an oxide layer on the gate electrode layer pattern where the ion implantation process is performed; and forming a nitride layer on the oxide layer with different thicknesses in the respective regions.

DESCRIPTION OF SPECIFIC EMBODIMENTS

Hereinafter, a method of fabricating a semiconductor device having a gate spacer layer with a uniform thickness in accordance with the invention is described in detail with reference to the accompanying drawings.

Figure 1:
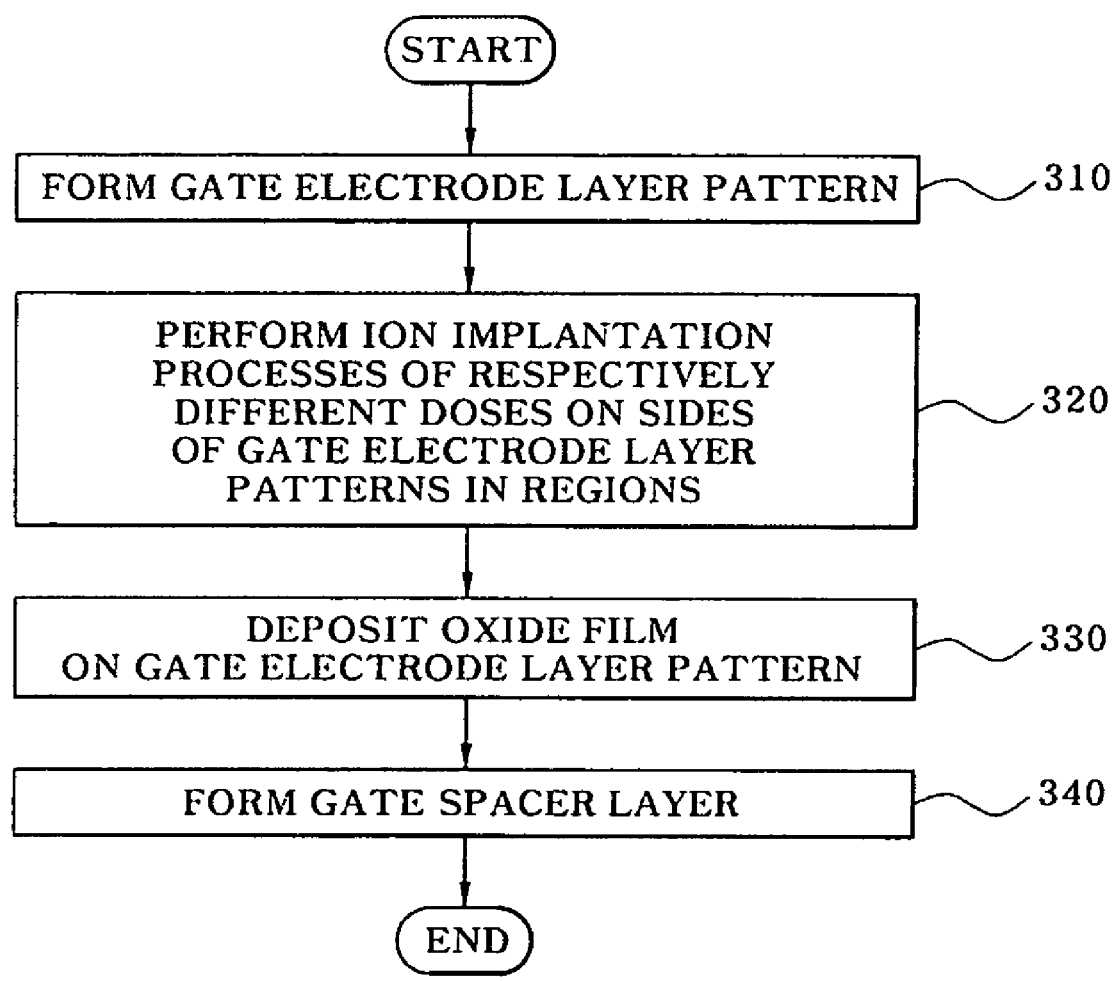
FIG. 1 illustrates a method of fabricating a semiconductor device according to the invention.

FIG. 1 illustrates a method of fabricating a semiconductor device according to the invention. FIGS. 2 to 6 illustrate each operation of FIG. 1. FIG. 7 illustrates a thickness change of an oxide layer deposition according to an ion-implanted dose.

Figure 2:
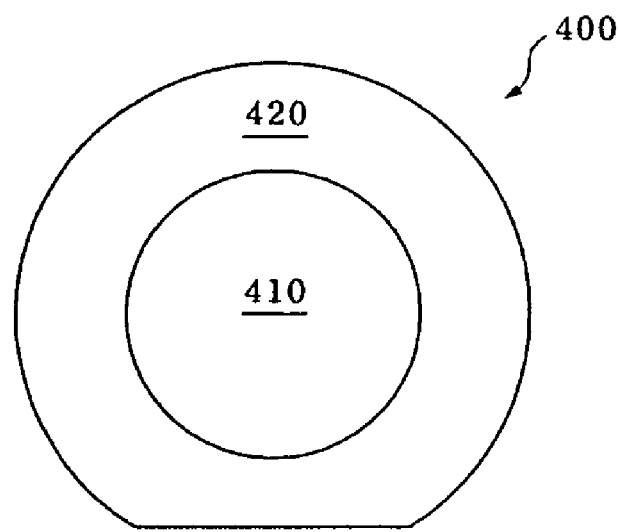
FIGS. 2 to 6 illustrate the operations of FIG. 1.

Referring to FIG. 2, a wafer 400 is divided into a first region 410 and a second region 420 based on a case where the thicknesses of the gate spacer layers of the first and second regions 410 and 420 become respectively different while forming a conventional gate spacer layer. For example, the thickness of the gate spacer layer is relatively thin in the first region 410 and the thickness of the gate spacer layer is relatively thick in the second region 420. In this embodiment, the wafer 400 is divided into two regions 410 and 420 for convenience. However, the wafer 400 can be substantially divided into the more number of regions, and this case also can be applied to the invention.

Figure 3:
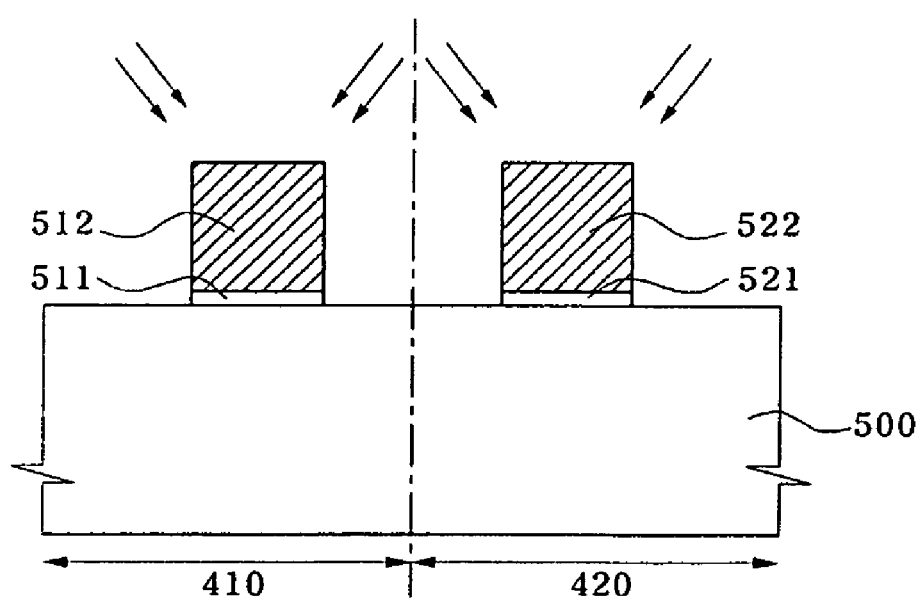

As illustrated in FIG. 3, gate electrode layer patterns 512 and 522 are formed on a substrate 500 in operation 310. Gate insulating layer patterns 511 and 521 are disposed between the substrate 500 and the gate electrode layer patterns 512 and 522. As illustrated in FIG. 2, the substrate 500 includes the first region 410 where the gate spacer layer deposition is relatively thin and a second region 420 where the gate spacer layer deposition is relatively thick. For convenience, the gate electrode layer pattern 512 of the first region 410 is called the first gate electrode layer pattern 512, and the second electrode layer pattern 522 of the second region 420 is called the second gate electrode layer pattern 522. In this embodiment, the first gate electrode layer pattern 512 and the second gate electrode layer pattern 522 include a polysilicon layer.

As indicated by arrows in FIG. 3, ion implantations of respective first and second doses of ions are respectively performed on the side of the first gate electrode layer pattern 512 and the side of the second gate electrode layer pattern 522 in operation 320. Implanted impurities are non-volatile elements such as Ar are P in this embodiment and may be B, As, $BF_2$, and $B_{18}H_{22}$ in another embodiment. A tilt ion implantation method is used to perform an ion implantation process on the sides of the first and second gate electrode layer patterns 512 and 522. The first dose and the second dose denote respectively different amounts of impurity concentrations, and are inversely proportional to the thickness of the gate spacer layer. That is, the first region 410 is a region where the gate spacer layer is relatively thinly deposited, and the second region 420 is a region where the gate spacer layer is relatively thickly deposited. Therefore, a relatively large amount of the first dose is ion implanted on the side of the first gate electrode layer pattern 512 in the first region 410, and a relatively small amount of the second dose is ion implanted on the side of the second gate electrode layer pattern 512 in the second region 420.

Figure 4:
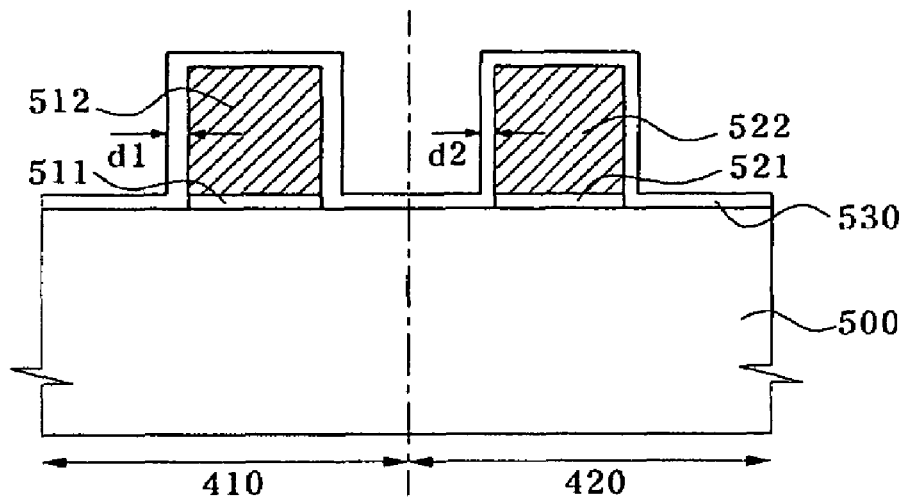

As illustrated in FIG. 4, an oxide layer 530 as a first gate spacer layer is deposited on the first and second gate electrode layer patterns 512 and 522 in operation 330. Generally, the oxide layer 530 is formed with a predetermined thickness, but in a case where an ion implantation process is performed on the surface of the substrate 500 between the first gate electrode layer pattern 512 and the second gate electrode layer pattern 522, the oxide layer 530 may have respectively different thicknesses on the substrate 500 according to its ion implantation concentration, i.e., an amount of a dose. A thicknesses change of an oxide layer deposition according to dopant concentration, i.e., an ion-implanted dose, is illustrated in FIG. 7. In FIG. 7, ■, ▲, and ● represent a high concentration, an intermediate concentration, and a low concentration, respectively. According to respective measurement results of when temperatures are 920° C., 1000° C., 1000° C., and 1100° C., respectively, the side of the first gate electrode layer pattern 512 and the side of the second gate electrode layer pattern 522 have respectively different thicknesses of the oxide layer 530. In operation 320, the oxide layer 530 is formed with a relatively thick first thickness d1 on the side of the first gate electrode layer pattern 512 having a relatively heavy ion implantation dose. In contrast, the oxide layer 530 is formed with a relatively thin second thickness d2 on the side of the second gate electrode layer pattern 522 having a relatively light ion implantation dose.

Figure 5:
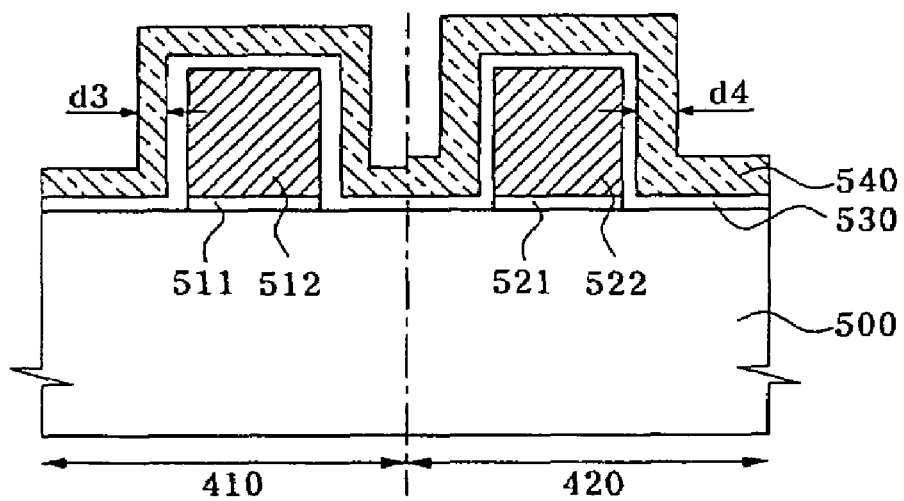

Referring to FIG. 5, a nitride layer as a second gate spacer layer is formed on the oxide layer 530. As illustrated in FIG. 2, the nitride layer 540 has a relatively thin thickness d3 in the first region 410, and in contrast, the nitride layer 540 has a relatively thick thickness d4 in the second region 420.

Figure 6:
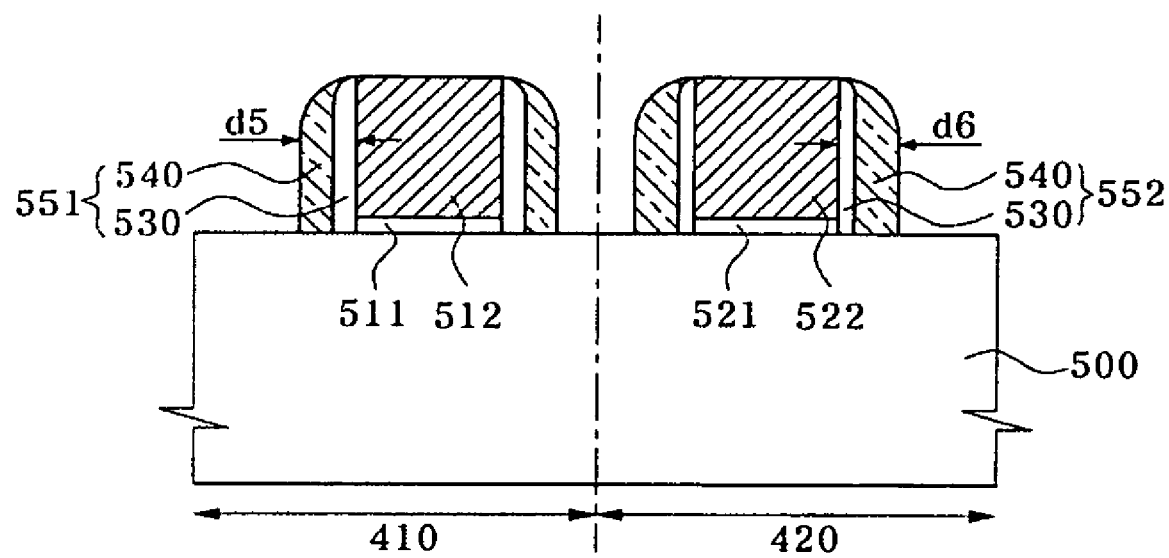
Figure 7:
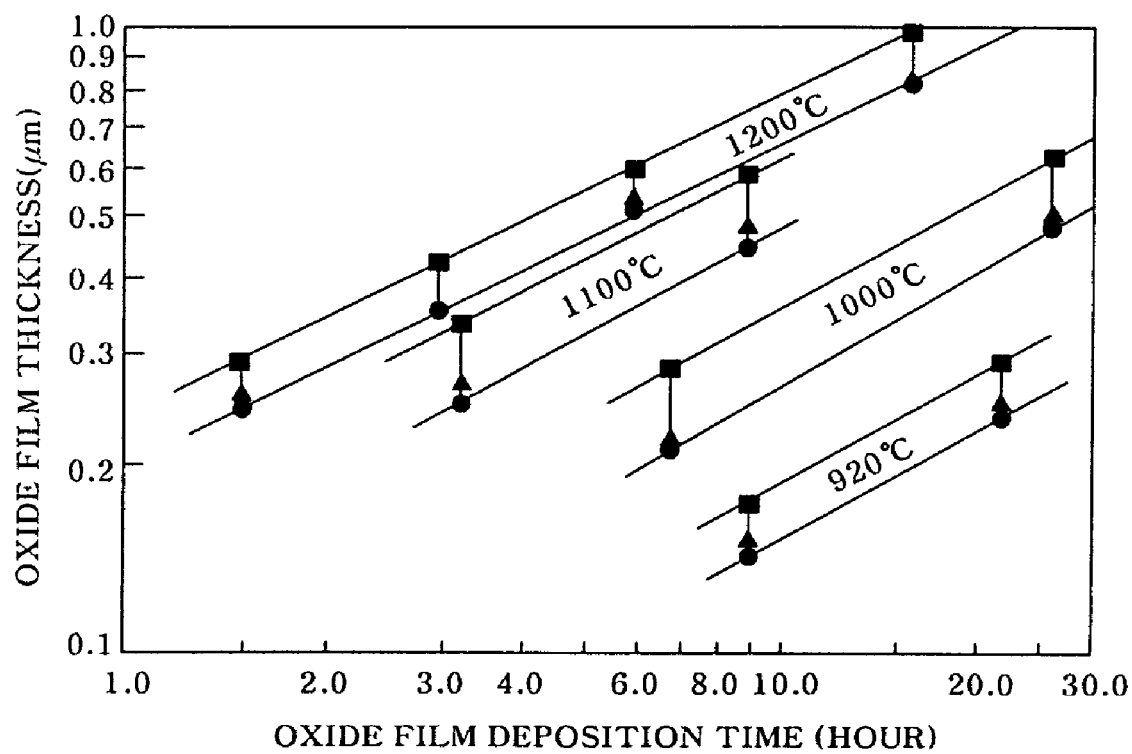
FIG. 7 illustrates a thickness change of an oxide layer deposition according to an ion-implanted dose.

Referring to FIG. 6, an anisotropic etching process is performed on the nitride layer 540 to form a first gate spacer layer 551 and a second gate spacer layer 522 on the side walls of the first and second gate electrode layer patterns 512 and 522, respectively. The first gate spacer layer 551 in the first region 410 includes an oxide layer 530 having a relatively thick thickness d1 and the nitride layer 540 having a relatively thin thickness d3. The second gate spacer layer 552 in the second region 420 includes an oxide layer 530 having a relatively thin thickness d2 and the nitride layer 540 having a relatively thick thickness d4. Accordingly, the thickness d5 of the first gate spacer layer 551 in the first region 410 and the thickness d6 of the second gate spacer layer 552 in the second region 420 substantially have the same thickness. Consequently, a gate spacer layer having a uniform thickness can be formed over an entire surface of the wafer.

While the invention has been described with respect to specific embodiments, various changes and modifications may be made without departing from the spirit and scope of the invention as defined in the following claims.

What is claimed is:

1. A method of fabricating a semiconductor device, the method comprising:
    defining a first region and a second region in a substrate, comprising forming a relatively thin first spacer layer in the first region and forming a relatively thick spacer layer in the second region by a spacer forming process;
    forming a first gate electrode layer pattern and a second gate electrode layer pattern in the first region and the second region on the substrate, respectively;
    performing first ion implantation processes of first doses of implanted ions on a side wall of the first gate electrode pattern;
    performing second ion implantation processes of second doses of implanted ions on a side wall of the second gate electrode pattern, wherein the second doses are different from the first doses;
    forming first gate spacer layers having a different thickness on the first gate electrode and the second gate electrode, respectively; and
    forming second gate spacer layers on the first gate spacer layers.

2. The method of claim 1, wherein the first gate spacer layers comprise oxide layers and the second gate spacer layers comprise nitride layers.

3. The method of claim 1, wherein the first and second ion implantation processes implant non-volatile components selected from the group consisting of P, B, As, $BF_2$, and $B_{18}H_{22}$.

* * * * *